(12) United States Patent
Hirata et al.

(10) Patent No.: US 9,083,352 B2
(45) Date of Patent: Jul. 14, 2015

(54) OSCILLATOR, OSCILLATING METHOD, IMAGE SENSOR, AND IMAGING APPARATUS

(71) Applicant: Sony Corporation, Tokyo (JP)

(72) Inventors: Eiji Hirata, Kanagawa (JP); Hiroaki Ebihara, Kanagawa (JP)

(73) Assignee: Sony Corporation, Tokyo (JP)

( * ) Notice: Subject to any disclaimer, the term of this patent is extended or adjusted under 35 U.S.C. 154(b) by 201 days.

(21) Appl. No.: 13/828,545

(22) Filed: Mar. 14, 2013

(65) Prior Publication Data

US 2013/0284887 A1 Oct. 31, 2013

(30) Foreign Application Priority Data

Apr. 26, 2012 (JP) .................................. 201-101341

(51) Int. Cl.
| | |
|---|---|
| H03K 3/03 | (2006.01) |
| H03L 5/02 | (2006.01) |
| H04N 5/369 | (2011.01) |
| H04N 5/376 | (2011.01) |
| H03K 3/354 | (2006.01) |

(52) U.S. Cl.
CPC ................. *H03L 5/02* (2013.01); *H04N 5/369* (2013.01); *H04N 5/3765* (2013.01); *H03K 3/0315* (2013.01); *H03K 3/354* (2013.01)

(58) Field of Classification Search
CPC . G01J 1/42; H04N 5/378; H04N 2005/91364; H04N 21/4223; H04N 21/4408; H04N 3/155; H04N 5/33; H04N 5/369; H04N 5/3765; H04N 5/772; H04N 5/913; G01C 3/08; G06K 9/4623; G06K 9/6212; G06K 9/224; H03K 3/354
USPC .......... 331/57; 250/208.1; 356/213; 327/156, 327/159

See application file for complete search history.

(56) References Cited

U.S. PATENT DOCUMENTS

| | | | | |
|---|---|---|---|---|
| 6,028,488 | A * | 2/2000 | Landman et al. | 331/1 A |
| 6,172,573 | B1 * | 1/2001 | Lim | 331/111 |
| 8,692,176 | B2 * | 4/2014 | Kelly et al. | 250/208.1 |

FOREIGN PATENT DOCUMENTS

| | | |
|---|---|---|
| JP | 2006-261833 A | 9/2006 |
| JP | 2008-236133 A | 10/2008 |

* cited by examiner

*Primary Examiner* — Arnold Kinkead
(74) *Attorney, Agent, or Firm* — Fishman Stewart Yamaguchi PLLC

(57) ABSTRACT

An oscillator includes: inverters that are connected in a loop shape and of which the number is an odd number greater than or equal to three; and a delay section that delays change in a voltage which is input to one inverter of the odd number of inverters. The one inverter is a schmitt trigger inverter. The schmitt trigger inverter includes a current source, and a resistor in which current supplied by the current source flows. A hysteresis width of the schmitt trigger inverter depends on the current which flows in the resistor.

15 Claims, 8 Drawing Sheets

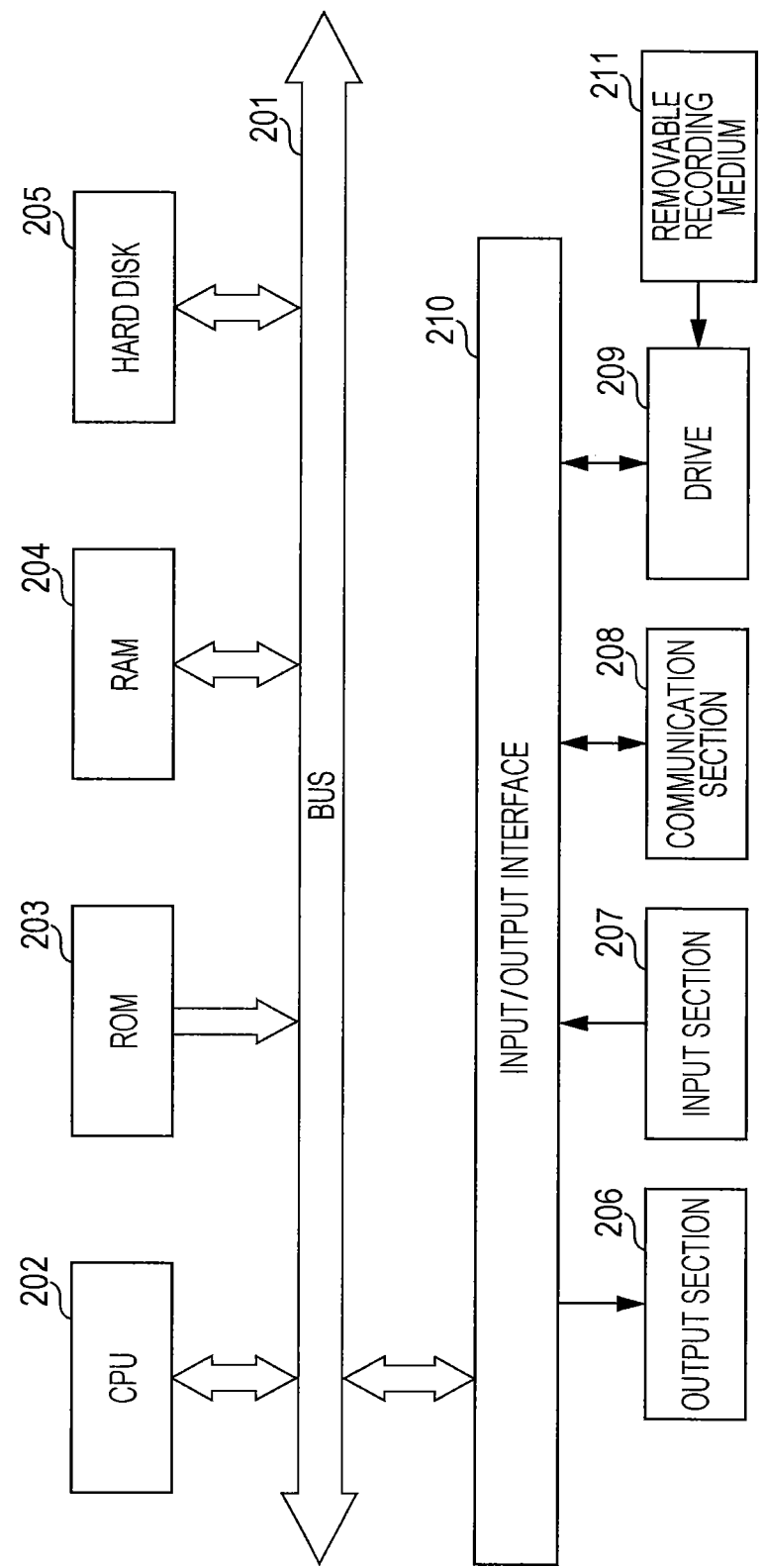

OSCILLATOR, OSCILLATING METHOD, IMAGE SENSOR, AND IMAGING APPARATUS

BACKGROUND

The present technology relates to an oscillator, an oscillating method, an image sensor and, an imaging apparatus. In particular, for example, the technology relates to an oscillator, an oscillating method, an image sensor, and, an imaging apparatus capable of being highly tolerant of variation of elements with low power consumption.

Examples of oscillators using a digital circuit including a CMOS (Complementary Metal Oxide Semiconductor) and the like include, for example, a ring oscillator in which an odd number of amplifiers are connected in a ring shape.

Further, as the ring oscillator, there is proposed a ring oscillator including a current source for varying the oscillatory frequency or a delay element such as a resistor or a capacitor (Japanese Unexamined Patent Application Publication Nos. 2006-261833 and 2008-236133).

Otherwise, as the oscillator using the digital circuit, there is a PLL (Phase Lock Loop) circuit capable of stably performing high-frequency oscillation through a feedback configuration.

SUMMARY

In the ring oscillators used in the related art, variation of elements causes fluctuation in the oscillatory frequency, and thus it is difficult to generate stable oscillation (at the oscillatory frequency).

In contrast, using the PLL circuit, it is possible to generate stable oscillation, but power consumption is large.

According to the present technology, it is desirable to provide an oscillator capable of being highly tolerant of variation of elements with low power consumption.

According to a first embodiment of the present technology, an oscillator includes: inverters that are connected in a loop shape and of which the number is an odd number greater than or equal to three; and a delay section that delays change in a voltage which is input to one inverter of the odd number of inverters. The one inverter is a schmitt trigger inverter. The schmitt trigger inverter includes a current source, and a resistor in which current supplied by the current source flows. A hysteresis width of the schmitt trigger inverter depends on the current which flows in the resistor.

According to a first embodiment of the present technology, an oscillating method delays change in a voltage input to one inverter of inverters, which are connected in a loop shape and of which the number is an odd number greater than or equal to three, by a delay section of an oscillator including the odd number of inverters and the delay section. The one inverter is a schmitt trigger inverter. The schmitt trigger inverter includes a current source, and a resistor in which current supplied by the current source flows. A hysteresis width of the schmitt trigger inverter depends on the current which flows in the resistor.

According to a second embodiment of the present technology, an image sensor is operated in synchronization with a signal that is output by an oscillator including inverters, which are connected in a loop shape and of which the number is an odd number greater than or equal to three, and a delay section which delays change in a voltage which is input to one inverter of the odd number of inverters. The one inverter is a schmitt trigger inverter. The schmitt trigger inverter includes a current source, and a resistor in which current supplied by the current source flows. A hysteresis width of the schmitt trigger inverter depends on the current which flows in the resistor.

According to a third embodiment of the present technology, an imaging apparatus includes: an oscillator that includes inverters, which are connected in a loop shape and of which the number is an odd number greater than or equal to three, and a delay section which delays change in a voltage which is input to one inverter of the odd number of inverters; and an image sensor that is operated in synchronization with a signal which is output by the oscillator. The one inverter is a schmitt trigger inverter. The schmitt trigger inverter includes a current source, and a resistor in which current supplied by the current source flows. A hysteresis width of the schmitt trigger inverter depends on the current which flows in the resistor.

In the first to third embodiments of the present technology, the change in the voltage that is input to one inverter of the inverters, which are connected in a loop shape and of which the number is an odd number greater than or equal to three, is delayed. The one inverter is the schmitt trigger inverter. The schmitt trigger inverter includes the current source, and the resistor in which current supplied by the current source flows. The hysteresis width of the schmitt trigger inverter depends on the current which flows in the resistor.

It should be noted that the oscillator and the image sensor may be separate devices and may be an internal block formed as one device.

According to the first to third embodiments of the present technology, it is possible to achieve lower power consumption. Further, according to the first to third embodiments of the present technology, it is possible to improve tolerance to variation of elements.

BRIEF DESCRIPTION OF THE DRAWINGS

FIG. 8 is a block diagram illustrating an exemplary configuration of a computer according to an embodiment of the present technology.

DESCRIPTION OF THE PREFERRED EMBODIMENTS

Embodiment of Digital Camera According to the Present Technology

Figure 1:
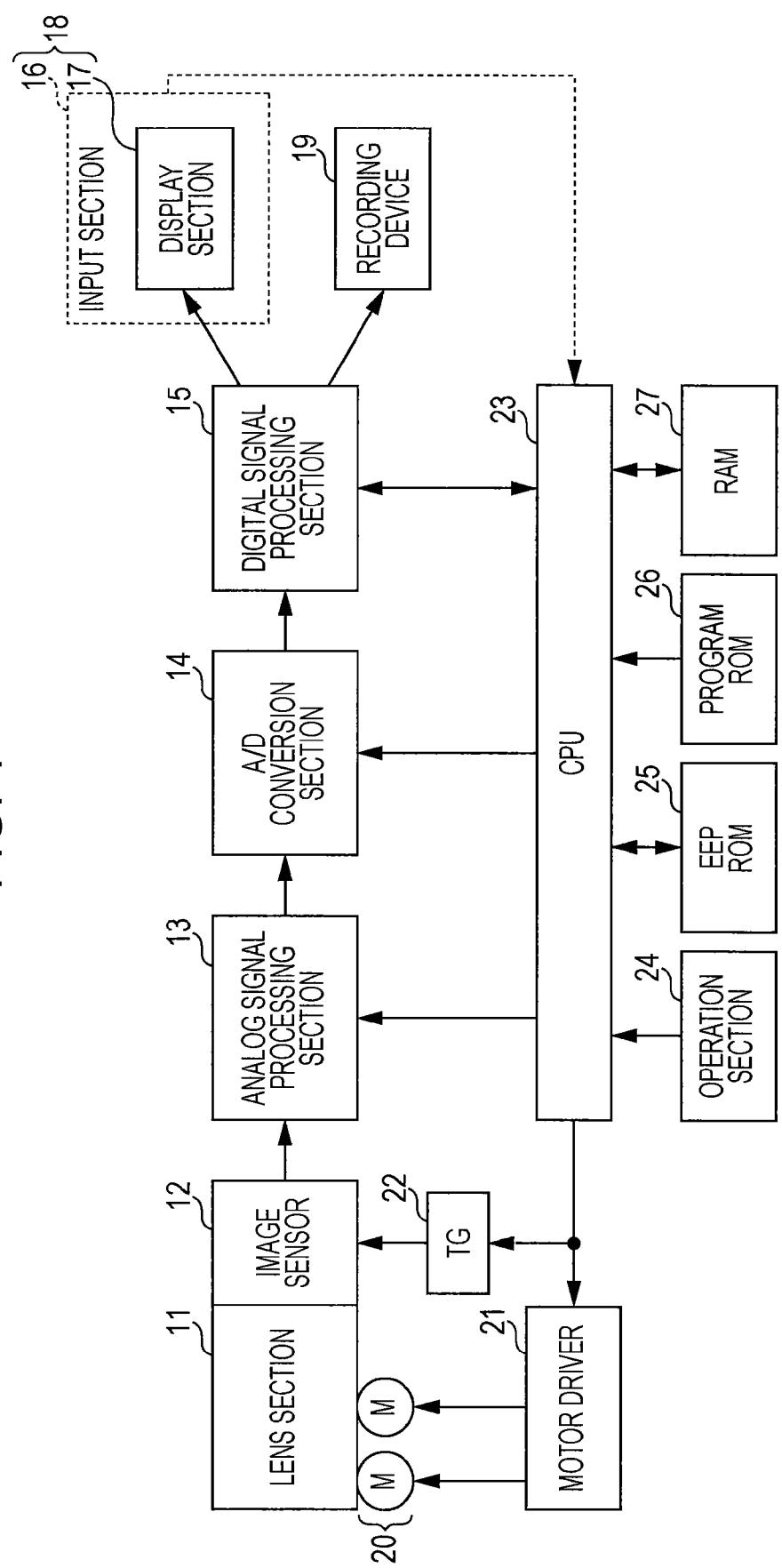
FIG. 1 is a block diagram illustrating an exemplary configuration of a digital camera according to an embodiment of the present technology.

FIG. 1 is a block diagram illustrating an exemplary configuration of a digital camera as an imaging apparatus according to an embodiment of the present technology.

A lens section 11 includes a photographic lens, an aperture diaphragm, a focus lens, and the like, and irradiates an image sensor 12 with light which is incident into the lens section 11.

The image sensor 12 includes, for example, a CCD (Charge Coupled Device) or CMOS (Complementary Metal Oxide Semiconductor) imager or the like, and operates in synchronization with a timing signal which is supplied from a TG 22 (Timing Generator).

The image sensor 12 photoelectrically converts light which is emitted from the lens section 11, and supplies an analog image signal, which is obtained from the result of the conversion, to an analog signal processing section 13.

The analog signal processing section 13 performs analog signal processing, such as a correlated double sampling processing or automatic gain adjustment processing, on the image signal which is sent from the image sensor 12, and supplies the signal to an A/D (Analog/Digital) conversion section 14.

The A/D (Analog/Digital) conversion section 14 performs A/D conversion on the image signal which is sent from the analog signal processing section 13, and supplies digital image data, which is obtained from the result thereof, to a digital signal processing section 15.

The digital signal processing section 15 performs digital signal processing such as white balance adjustment processing, noise removal processing, necessary compression coding processing (for example, JPEG (Joint Photographic Experts Group) encoding, MPEG (Moving Picture Experts Group) encoding, and like) on the image data which is sent from the A/D conversion section 14, and supplies the signal to (a display section 17 of) an input/output panel 18 or a recording device 19.

The input/output panel 18 includes an input section 16 and the display section 17.

The input section 16 includes a group of: a device that has a function of receiving (sensing) an input from the outside, that is, for example, a static touch panel; a light source that emits light; a sensor that receives light reflected from an object; and the like.

When an object such as a user's finger or a touch pen used by a user approaches from the outside or touches the input section 16, the input section 16 supplies a signal, which indicates a position of the approach or touch, to a CPU 23.

The display section 17 includes a device which displays an image (display device) such as a liquid crystal panel or an organic EL (Electro Luminescence) panel, and displays an image on the basis of the image data supplied from the digital signal processing section 15.

The input/output panel 18 is integrally formed of the input section 16 and the display section 17 mentioned above, displays an image on the display section 17, and is able to receive an operation input which is sent from the outside and is performed on the image displayed on the display section 17 in the input section 16.

It should be noted that, as the input/output panel 18, for example, a so-called touch screen or the like may be employed.

For example, a removable recording medium (not shown in the drawing) other than a semiconductor memory such as a memory card or a disc such a DVD (Digital Versatile Disc) is detachably mounted in a recording device 19. The recording device 19 performs control for recording and reproducing the image data on the mounted recording medium.

That is, the recording device 19 records the image data, which is sent from the digital signal processing section 15, on the recording medium, further reads the image data which is recorded on the recording medium, and supplies the image data to the digital signal processing section 15.

An actuator 20 is a motor that adjusts a diaphragm of a focus lens of the lens section 11, and is driven by a motor driver 21.

The motor driver 21 drives the actuator 20 in accordance with the control of the CPU (Central Processing Unit) 23.

The TG (Timing Generator) 22 supplies a timing signal for adjusting exposure time or a timing signal for reading electric charges as pixel values in the image sensor 12 to the image sensor 12, in accordance with the control of the CPU 23. Otherwise, the TG 22 supplies a desired timing signal to a desired block.

The CPU 23 executes a program, which is stored in a program ROM (Read Only Memory) 26, and further executes a program, which is stored in an EEPROM (Electrically Erasable Programmable ROM) 25, as necessary, thereby controlling the respective blocks constituting the digital camera.

An operation section 24 is a physical button operated by a user, and supplies a signal, which corresponds to the user's operation, to the CPU 23.

The EEPROM 25 stores data or a program, such as an imaging parameter that is set through the user's operation performed in the operation section 24 or the like, for which it is necessary to be held even when power of the digital camera is turned off.

The program ROM 26 stores a program or the like executed by the CPU 23.

A RAM 27 temporarily stores data or a program which is necessary for the operation of the CPU 23.

In the digital camera configured as described above, the CPU 23 executes the program which is stored in the program ROM 26, thereby controlling the respective section of the digital camera.

Meanwhile, the image sensor 12 operates in synchronization with the timing signal which is supplied from the TG 22, and photoelectrically converting light which is incident into the lens section 11. In the image sensor 12, the image signal, which is obtained from the result of the photoelectric conversion, is supplied to the analog signal processing section 13.

In the analog signal processing section 13, the image signal, which is sent from the image sensor 12, is subjected to the analog signal processing, and is supplied to the A/D conversion section 14. In the A/D conversion section 14, the image signal, which is sent from the analog signal processing section 13, is A/D converted, and the digital image data, which is obtained from the result of the conversion, is supplied to the digital signal processing section 15.

In the digital signal processing section 15, the image data, which is sent from the A/D conversion section 14, is subjected to the digital signal processing, and is supplied to (the display section 17 of) the input/output panel 18, whereby the corresponding image, that is, a so-called through-the-lens image is displayed.

Further, the CPU 23 executes predetermined processing in accordance with the signal which is sent from the operation section 24 or (the input section 16 of) the input/output panel 18.

That is, for example, when the input/output panel 18 or the operation section 24 is operated to capture an image, the CPU 23 controls the digital signal processing section 15, performs the compression coding processing on the image data which is sent from the A/D conversion section 14, thereby recording the image data on the recording medium through the recording device 19.

Further, for example, when the input/output panel 18 or the operation section 24 is operated to reproduce the image, the CPU 23 controls the digital signal processing section 15, thereby reading the image data from the recording medium through the recording device 19.

Furthermore, the CPU 23 causes the digital signal processing section 15 to expand the image data which is read from the recording medium, and supplies the image data to the input/output panel 18, thereby displaying the image data.

Exemplary Configuration of TG 22

Figure 2:
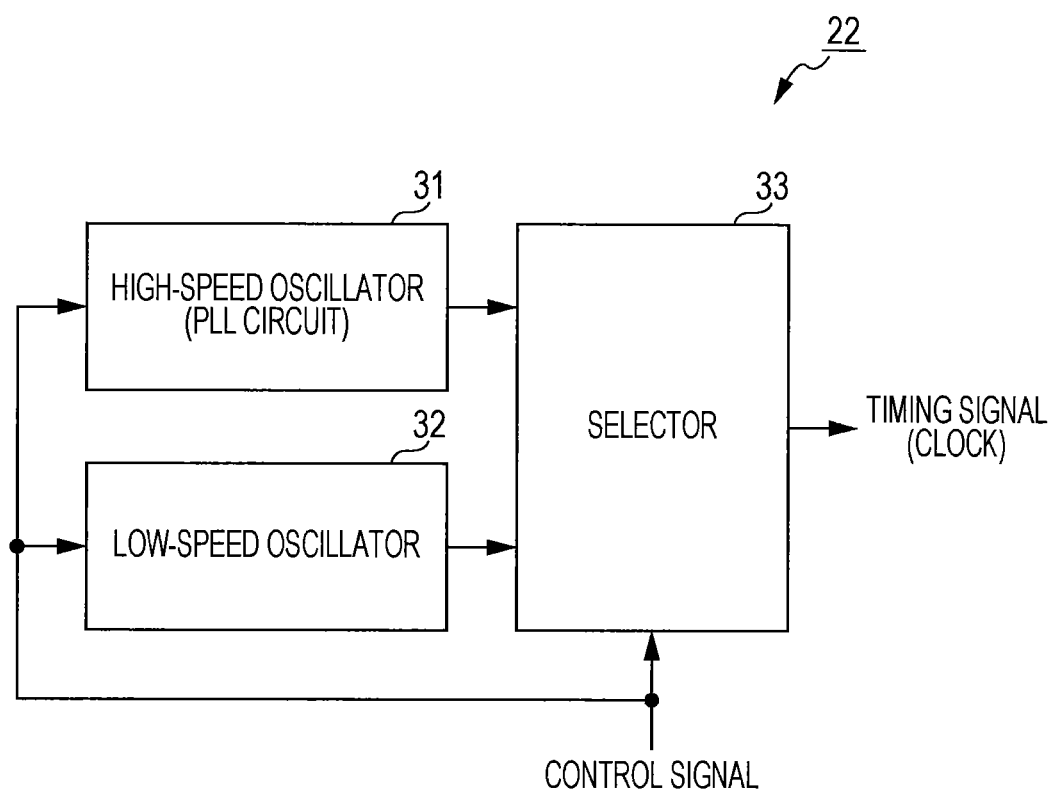
FIG. 2 is a block diagram illustrating an exemplary configuration of a timing generator.

FIG. 2 is a block diagram illustrating an exemplary configuration of the TG 22 of FIG. 1.

In FIG. 2, the TG 22 has a high-speed oscillator 31, a low-speed oscillator 32, and a selector 33.

The high-speed oscillator 31 is, for example, a PLL circuit, and generates a high-speed clock (reference clock), which is necessary to capture an image by the image sensor 12 (FIG. 1), when the operation mode of the digital camera is a normal mode for the normal image capturing, in accordance with the control of the CPU 23 (FIG. 1), and supplies the clock to the selector 33.

The low-speed oscillator 32 is, for example, a ring oscillator, and generates a low-speed (low frequency) clock of the high-speed oscillator 31, used in the image sensor 12, when the operation mode of the digital camera is a low-speed mode in which it is not necessary for the image sensor 12 to operate at a high speed like the above-mentioned case, in accordance with the control of the CPU 23, and supplies the clock to the selector 33.

The selector 33 selects one of the clock, which is supplied from the high-speed oscillator 31, and the clock, which is supplied from the low-speed oscillator 32, in accordance with the control of the CPU 23, and supplies the clock as a timing signal to the image sensor 12.

Here, the image sensor 12 photoelectrically converts the light which is incident on it. Therefore, the image sensor 12 is not only used for image capturing but also can be used as, for example, an illuminance sensor for measuring the illuminance. When the image sensor 12 is used as the illuminance sensor, it is not necessary for the image sensor 12 to operate at a high speed like the case of capturing an image.

Accordingly, in the digital camera, when the illuminance is measured by using the image sensor 12 as the illuminance sensor, the CPU 23 sets the operation mode as the low-speed mode, and causes the selector 33 to select the clock which is supplied from the low-speed oscillator 32, thereby supplying the clock to the image sensor 12.

Meanwhile, in the digital camera, in the case of capturing an image, the CPU 23 sets the operation mode as a normal mode, and causes the selector 33 to select the clock which is supplied from the high-speed oscillator 31, thereby supplying the clock to the image sensor 12.

As described above, in the low-speed mode in which it is not necessary for the image sensor 12 to operate at a high speed, the low-speed clock, which is obtained by the low-speed oscillator 32 and is slower than the clock of the high-speed oscillator 31, is supplied to the image sensor 12, and the image sensor 12 operates in synchronization with the low-speed clock. Consequently, in the low-speed mode, it is possible to reduce power consumption of the image sensor 12 compared with the case of the normal mode.

That is, in the low-speed mode, the image sensor 12 is operated in synchronization with the low-speed clock of the low-speed oscillator 32. Thereby, compared with the case where the image sensor 12 is operated in synchronization with the high-speed clock of the high-speed oscillator 31, it is possible to reduce power consumption of the image sensor 12.

Brief Overview of Configuration of Low-Speed Oscillator 32

Figure 3:
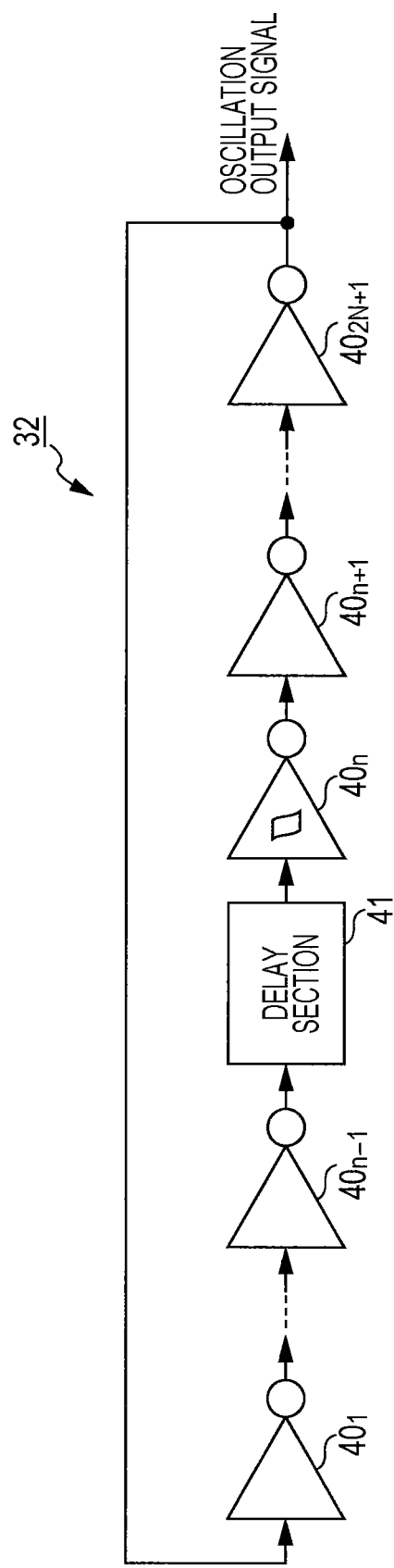
FIG. 3 is a block diagram illustrating a brief overview of a configuration of a low-speed oscillator.

FIG. 3 is a block diagram illustrating a brief overview of a configuration of the low-speed oscillator 32 of FIG. 2.

In FIG. 3, the low-speed oscillator 32 includes: 2N+1 (N is an integer of 1 or more) inverters $40_1$, $40_2$, . . . , $40_{n-1}$, $40_n$, $40_{n+1}$, . . . , and $40_{2N+1}$ of which the number is an odd number greater than or equal to three; and a delay section 41.

The 2N+1 inverters $40_1$ to $40_{2N+1}$ are connected in a loop shape in this order, and the inverter $40_i$ (i=1, 2, . . . , or 2N+1) inverts and outputs the (voltage) level which is input thereto.

In addition, in FIG. 3, the output of the final-stage inverter $40_{2N+1}$ is given as an oscillation output signal which is the output of the low-speed oscillator 32.

One inverter $40_n$ of the 2N+1 inverters $40_1$ to $40_{2N+1}$ (n is an arbitrary integer in the range of 1 to 2N+1) is formed as a schmitt trigger inverter. Hereinafter, the inverter $40_n$ is also referred to as a schmitt trigger inverter $40_n$.

The delay section 41 is provided in the pre-stage of the schmitt trigger inverter $40_n$, and thus delays change in the voltage (change in the output of the pre-stage inverter $40_{n-1}$) which is input to the schmitt trigger inverter $40_n$.

Here, the amount of delay of the change in the voltage (hereinafter also referred to as a schmitt trigger input voltage), which is input to the schmitt trigger inverter $40_n$, in the delay section 41 defines the oscillatory period (oscillatory frequency) of the low-speed oscillator 32. The amount of delay of the delay section 41 depends on the hysteresis width of the schmitt trigger inverter $40_n$ and the like.

In the low-speed oscillator 32 configured as described above, the oscillation output signal, which is output of the final-stage inverter $40_{2N+1}$, is input to the first-stage inverter $40_1$, is inverted in the inverter $40_1$, and is output to the next-stage inverter $40_2$.

Hereinafter, likewise, the output of the pre-stage inverter $40_{i-1}$ is input to each inverter $40_i$, and in each inverter $40_i$, the output of the pre-stage inverter $40_{i-1}$ is inverted, and is given to the next-stage inverter $40_{i+1}$.

The number 2N+1 of the inverters $40_1$ to $40_{2N+1}$ constituting the low-speed oscillator 32 is an odd number. Hence, in the low-speed oscillator 32, the level of inverted input of the first-stage inverter $40_1$ is output from the final-stage inverter $40_{2N+1}$, and the output of the final-stage inverter $40_{2N+1}$ is input to the first-stage inverter $40_1$. As a result, the low-speed oscillator 32 oscillates.

In addition, in the low-speed oscillator 32, the inverter $40_{n-1}$ inverts the output of the pre-stage inverter $40_n$-2, and thereafter supplies the output to the delay section 41 in the next stage thereof.

The delay section 41 delays change in the output of the inverter $40_{n-1}$ which is the schmitt trigger input voltage, and gives the input thereof as the schmitt trigger input voltage to the schmitt trigger inverter $40_n$.

In the low-speed oscillator 32, in the delay section 41, it is possible to adjust the rate of the change in the schmitt trigger input voltage, and thus it is possible to adjust the hysteresis width in the schmitt trigger inverter $40_n$.

In the low-speed oscillator 32, the oscillatory period (the inverse of the oscillatory frequency), that is, the period of the oscillation output signal depends on the rate of the change in the schmitt trigger input voltage and the hysteresis width of the schmitt trigger inverter $40_n$.

Consequently, in the low-speed oscillator 32, by adjusting the rate of the change in the schmitt trigger input voltage and the hysteresis width, it is possible to control the oscillatory frequency as a variable.

First Exemplary Configuration of Low-Speed Oscillator 32

Figure 4:
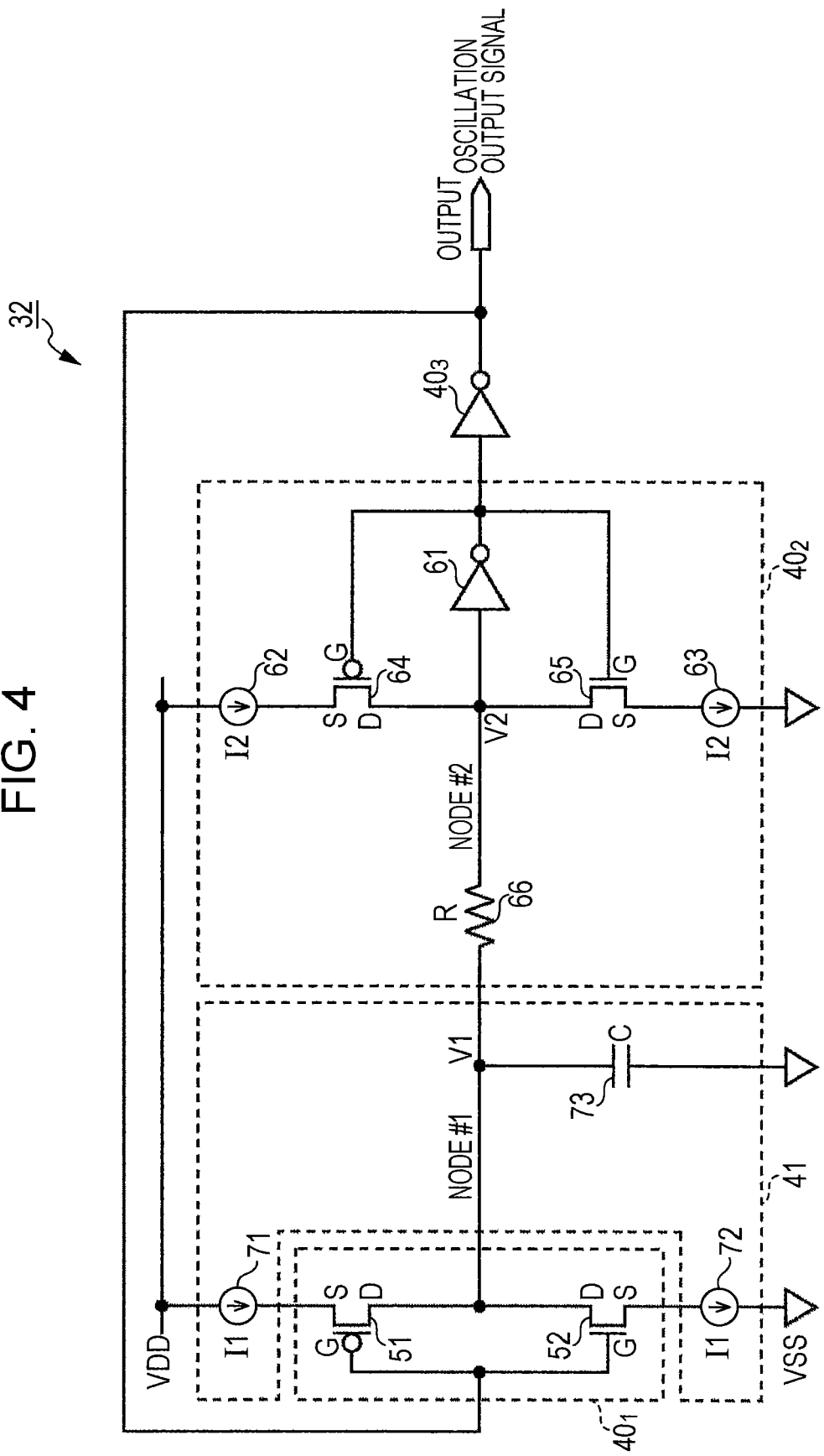
FIG. 4 is a block diagram illustrating a first exemplary configuration of the low-speed oscillator.

FIG. 4 is a block diagram (circuit diagram) illustrating a first exemplary configuration of the low-speed oscillator 32 of FIG. 2.

It should be noted that, in the drawing, the portions corresponding to those in the case of FIG. 3 are represented by the same reference numerals and signs, and hereinafter the description thereof will be properly omitted.

In FIG. 4, the low-speed oscillator 32 has the three inverters $40_1$, $40_2$, and $40_3$, and the delay section 41.

Further, in FIG. 4, the second-stage inverter $40_2$ of the three inverters $40_1$ to $40_3$, which are connected in a loop shape, is formed as a schmitt trigger inverter.

The inverter $40_1$ is a CMOS (Complementary MOS) inverter in which the drains of a pMOSFET (positive channel Metal Oxide Semiconductor Field Effect Transistor) 51 and an nMOSFET (negative channel MOSFET) 52 are connected to each other and the gates thereof are connected to each other.

The input terminal of the inverter $40_1$ is a connection point between the gates of the FETs 51 and 52, and the output terminal of the inverter $40_1$ is a connection point between the drains of the FETs 51 and 52.

The inverters other than the schmitt trigger inverter $40_2$, that is, the inverters $40_1$ and $40_3$ in FIG. 4 are formed as the CMOS inverters mentioned above.

The schmitt trigger inverter $40_2$ has an inverter 61, current sources 62 and 63, FETs 64 and 65, and a resistor 66.

The inverter 61 is, for example, the CMOS inverter like the inverter $40_1$, and the output terminal of the inverter 61 is connected to the input terminal of the next-stage inverter $40_3$. Accordingly, the output of the inverter 61 is given as the output of the schmitt trigger inverter $40_2$.

Furthermore, the output terminal of the inverter 61 is connected to the gates of the FETs 64 and 65, and the input terminal of the inverter 61 is connected to the respective drains of the FETs 64 and 65.

The current source 62 is connected between the power supply of the voltage VDD and the source of the FET 64, and flows current from the power supply toward the FET 64.

The current source 63 is connected between the GND (ground) of the voltage (electric potential) VSS and the source of the FET 65, and flows current from the FET 65 toward the GND.

It should be noted that the current sources 62 and 63 flow the same current I2 (with the same current value).

The FET 64 is a pMOSFET, and the FET 65 is an nMOSFET, and the drains of the FETs 64 and 65 are connected to each other.

The FETs 64 and 65 function as a switch that changes the direction of the current flowing in the resistor 66 in response to the oscillation output signal which is output by the low-speed oscillator 32, that is, the output of the final-stage inverter $40_3$.

One end of the resistor 66 is connected to the connection point (the input terminal of the inverter 61) between the drains of the FETs 64 and 65, and the other end of the resistor 66 is connected to the output terminal of the pre-stage inverter $40_1$ through the delay section 41 as the input terminal of the schmitt trigger inverter $40_2$.

In the resistor 66, as described later, the current I2 flowed by the current source 62 or the current I2 flowed by the current source 63 flows.

The delay section 41 has current sources 71 and 72, and a capacitor 73.

The current source 71 is connected between the power supply and the source of the FET 51 constituting the inverter $40_1$, and flows current from the power supply toward the FET 51.

The current source 72 is connected between the GND and the source of the FET 52, and flows current from the FET 52 toward the GND.

It should be noted that the current sources 71 and 72 flow the same current I1.

Further, in the embodiment, for example, the current I1 flowed by the current sources 71 and 72 is larger than the current I2 flowed by the current source 62 and 63. It should be noted that the current I1 is smaller than the current I2.

One end of the capacitor 73 is grounded to the GND, and the other end thereof is connected to the output terminal of the pre-stage inverter $40_1$ and the other end of the resistor 66 as the input terminal of the schmitt trigger inverter $40_2$ connected to the output terminal of the pre-stage inverter $40_1$.

Hereinafter, the other end (the input terminal of the schmitt trigger inverter $40_2$) of the resistor 66 is properly referred to as a node #1, and the voltage of the node #1 is properly referred to as a voltage V1. Further, hereinafter, one end (the input terminal of the inverter 61, the connection point between the drains of the FETs 64 and 65) of the resistor 66 is properly referred to as a node #2, and the voltage of the node #2 is properly referred to as a voltage V2.

Figure 5:
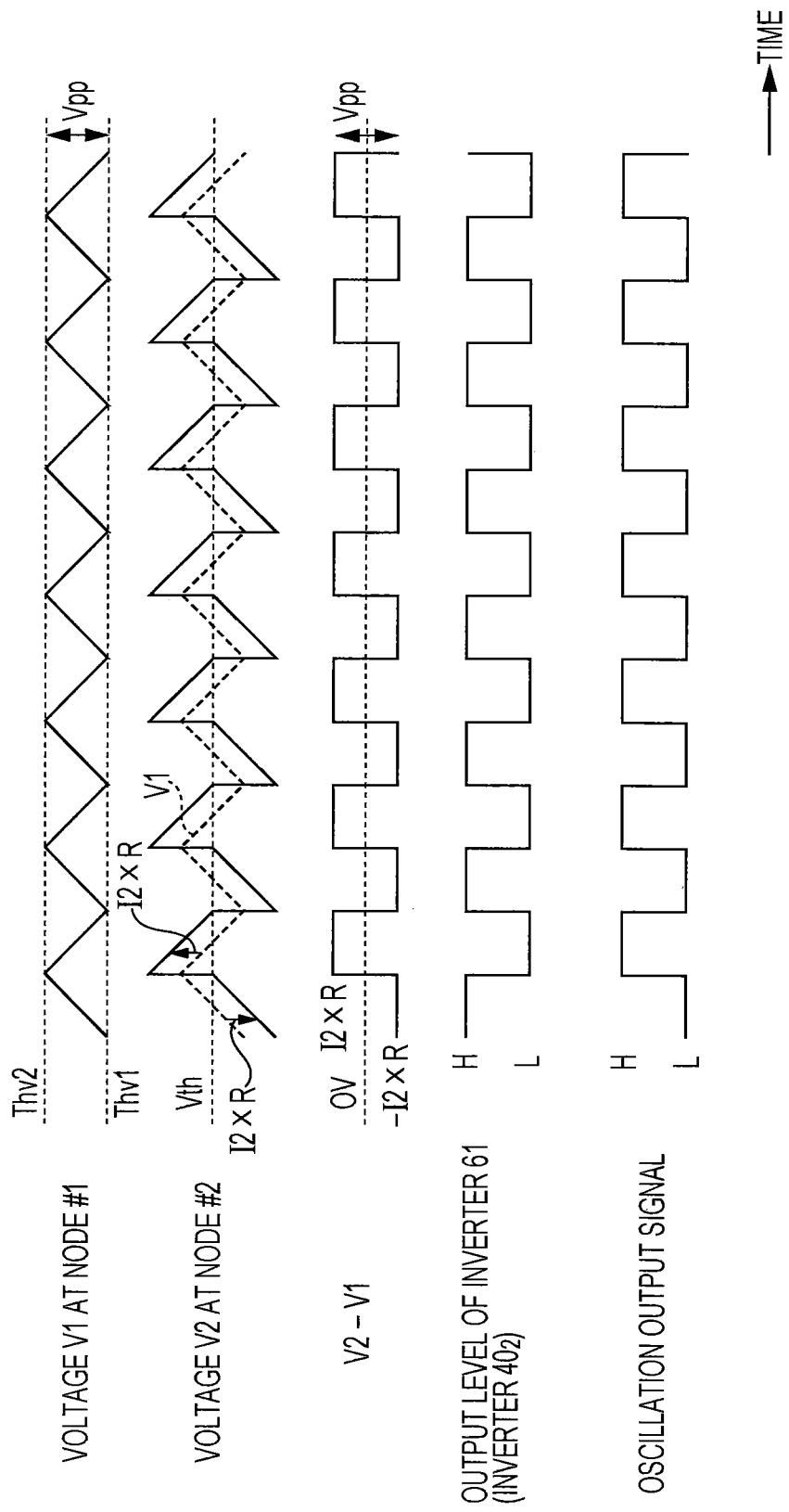
FIG. 5 is a timing chart illustrating an operation of the low-speed oscillator.

FIG. 5 is a timing chart illustrating an operation of the low-speed oscillator 32 of FIG. 4.

In the low-speed oscillator 32 of FIG. 4, in accordance with whether the polarity of the oscillation output signal which is the output of the low-speed oscillator 32 is the H (High) level or the L (Low) level, the direction of the current, which flows in the resistor 66 and the capacitor 73, is changed by on/off states of the FETs 64 and 65 as switches.

Specifically, for example, if the oscillation output signal is the L level, the pMOSFET 51 of the inverter $40_1$, of which the input terminal is supplied with the oscillation output signal, is turned on, and the nMOSFET 52 is turned off.

Further, if the oscillation output signal is the L level, the output of the inverter 61, which is the input of the inverter $40_3$ outputting the oscillation output signal and is consequently the output of the schmitt trigger inverter $40_2$, is at the H level. Consequently, regarding the pMOSFET 64 and the nMOSFET 65 of which the gates are supplied with the output of the inverter 61 with the H level, the FET 64 is turned off, and the FET 65 is turned on.

As a result, the current flows from the current source 71 to the FET 51, which is turned on, and flows to the node #1.

The current, which flows to the node #1, flows (is injected) to the capacitor 73.

Furthermore, the current, which flows to the node #1, flows to the resistor 66, the node #2, and the FET 65 which is turned on, and flows to the current source 63.

The current I1, which is flowed by the current source 71, flows from the current source 71 toward the node #1 through the FET 51.

Further, the current I2, which is flowed by the current source 63, flows from the node #1 toward the current source 63 through the resistor 66, the node #2, and the FET 65.

Accordingly, the current I1−I2 of the difference between the current I1, which is flowed by the current source 71, and the current I2, which is flowed by the current source 63, is injected from the node #1 to the capacitor 73 (in the capacitor 73, the current I1−I2 of the difference flows from the node #1 toward the GND).

Meanwhile, if the oscillation output signal is the H level, the pMOSFET 51 of the inverter $40_1$, of which the input terminal is supplied with the oscillation output signal, is turned off, and the nMOSFET 52 is turned on.

Further, if the oscillation output signal is the H level, the output of the inverter 61, which is the input of the inverter $40_3$ outputting the oscillation output signal and is consequently the output of the schmitt trigger inverter $40_2$, is at the L level. Consequently, regarding the pMOSFET 64 and the nMOSFET 65 of which the gates are supplied with the output of the inverter 61 with the L level, the FET 64 is turned off, and the FET 65 is turned off.

As a result, the current flows from the current source 62 to the node #1 through the FET 64 which is turned on, the node #2, and the resistor 66.

Furthermore, the current, which is discharged from the capacitor 73, flows to the node #1.

The current, which flows to the node #1, flows to the current source 72 through the FET 52 which is turned on.

The current I2, which is flowed by the current source 62, flows from the current source 62 to the node #1 through the FET 64, the node #2, and the resistor 66.

Further, the current I1, which is flowed by the current source 72, flows from the node #1 toward the current source 72 through the FET 52.

Accordingly, the current I1-I2 of the difference between the current I1, which is flowed by the current source 72, and the current I2, which is flowed by the current source 62, is discharged from the capacitor 73 to the node #1 (in the capacitor 73, the current I1-I2 of the difference flows from the GND toward the node #1).

As described above, in the low-speed oscillator 32, in response to the polarity of the oscillation output signal, the current I1-I2 of the difference (hereinafter referred to as differential current) between the currents I1 and I2 is injected to the capacitor 73 or discharged.

When the differential current I1-I2 is injected to the capacitor 73, in the resistor 66, the current I2, which is flowed by the current source 63, flows from the node #1 toward the node #2. In this case, the resistance value of the resistor 66 is represented by R, and then the voltage V2 at the node #2 is represented by a voltage V1-I2×R which is lower than the voltage V1 at the node #1 by the voltage drop I2×R occurring in the resistor 66.

Further, when the differential current I1-I2 is discharged from the capacitor 73, in the resistor 66, the current I2, which is flowed by the current source 62, flows from the node #2 toward the node #1. In this case, the voltage V2 at the node #2 becomes equal to a voltage V1+I2×R which is higher than the voltage V1 at the node #1 by the voltage drop I2×R occurring in the resistor 66.

The voltage V2 at the node #2, which is input to the inverter 61, may increase or decrease, and may become greater than the threshold value Vth (the voltage of the input of the inverter 61 when the output of the inverter 61 is inverted) of the inverter 61 (or may become equal to the threshold value Vth). In this case, the polarity of the output of the inverter 61 and consequently the polarity of the oscillation output signal is inverted, and injection and discharge of the differential current I1-I2 to and from the capacitor 73 are switched, and consequently the direction of the current I2, which flows in the resistor 66, is changed.

During oscillation of the low-speed oscillator 32, as described above, by switching the injection and the discharge of the differential current I1-I2 to and from the capacitor 73, the voltage V1 at the node #1 is output in the form of a (substantially) triangular wave, as shown in FIG. 5.

That is, when the differential current I1-I2 is injected to the capacitor 73, the voltage V1 at the node #1 is approximately linearly increased by the charge of electric charges in the capacitor 73. When the differential current I1-I2 is discharged from the capacitor 73, the voltage V1 at the node #1 is approximately linearly decreased by the discharge of the electric charges from the capacitor 73.

At this time, when the output of the inverter 61 is at the H level (the FET 64 is turned off, and the FET 65 is turned on), the differential current I1-I2 is injected to the capacitor 73, and thus the voltage V1 at the node #1 increases.

When the differential current I1-I2 is injected to the capacitor 73, the current I2, which flows in the resistor 66, flows from the node #1 toward the node #2. As a result, the voltage V2 at the node #2 as the input of the inverter 61 becomes equal to the voltage V1-I2×R which is lower than the voltage V1 at the node #1 by the voltage drop I2×R in the resistor 66. Furthermore, as shown in FIG. 5, the voltage V2 at the node #2 increases as the voltage V1 at the node #1 increases.

When the voltage V2=V1-I2×R at the node #2 increases and becomes greater than or equal to (or greater than) the threshold value Vth of the inverter 61, the output of the inverter 61 is inverted from the H level to the L level, as shown in FIG. 5.

When the output of the inverter 61 is at the L level, the differential current I1-I2 begins to be discharged from the capacitor 73. Further, the direction of the current I2, which flows in the resistor 66, is changed from the direction from the node #1 to the node #2 into the direction from the node #2 to the node #1.

As described above, the direction of the current I2, which flows in the resistor 66, is changed from the direction from the node #1 to the node #2 into the direction from the node #2 to the node #1. Then, the voltage V2 at the node #2 becomes equal to the voltage V1+I2×R which is higher than the voltage V1 at the node #1 by the voltage drop I2×R in the resistor 66.

Accordingly, the voltage V2 at the node #2 as the voltage V1-I2×R, which is lower than the voltage V1 at the node #1 by the voltage drop I2×R in the resistor 66, increases, and becomes equal to the threshold value Vth of the inverter 61. At this moment, as shown in FIG. 5, the voltage V2 at the node #2 rapidly increases from the voltage V1-I2×R, which is lower than the voltage V1 at the node #1 by the voltage drop I2×R in the resistor 66, to the voltage V1+I2×R which is higher than the voltage V1 at the node #1 by the voltage drop I2×R in the resistor 66.

When the output of the inverter 61 is at the L level, as described above, the differential current I1-I2 begins to be discharged from the capacitor 73. Thus, the voltage V1 at the node #1 decreases.

When the differential current I1-I2 is discharged from the capacitor 73, the current I2, which flows in the resistor 66, flows from the node #2 toward the node #1. As a result, the voltage V2 at the node #2 as the input of the inverter 61 becomes equal to the voltage V1+I2×R which is higher than the voltage V1 at the node #1 by the voltage drop I2×R in the resistor 66. Further, as shown in FIG. 5, the voltage V2 at the node #2 decreases as the voltage V1 at the node #1 decreases.

When the voltage V2=V1-I2×R at the node #2 decreases and becomes less than (or less than or equal to) the threshold value Vth of the inverter 61, the output of the inverter 61 is inverted from the L level to the H level, as shown in FIG. 5.

When the output of the inverter 61 is at the H level, the differential current I1-I2 begins to be injected to the capacitor 73. Further, the direction of the current I2, which flows in the resistor 66, is changed from the direction from the node #2 to the node #1 into the direction from the node #1 to the node #2.

As described above, the direction of the current I2, which flows in the resistor 66, is changed from the direction from the node #2 to the node #1 into the direction from the node #1 to the node #2. Then, the voltage V2 at the node #2 becomes equal to a voltage V1−I2×R which is lower than the voltage V1 at the node #1 by the voltage drop I2×R in the resistor 66.

Accordingly, the voltage V2 at the node #2 as the voltage V1+I2×R, which is higher than the voltage V1 at the node #1 by the voltage drop I2×R in the resistor 66, decreases, and becomes equal to the threshold value Vth of the inverter 61. At this moment, as shown in FIG. 5, the voltage V2 at the node #2 rapidly decreases from the voltage V1+I2×R, which is higher than the voltage V1 at the node #1 by the voltage drop I2×R in the resistor 66, to the voltage V1−I2×R which is lower than the voltage V1 at the node #1 by the voltage drop I2×R in the resistor 66.

When the output of the inverter 61 is at the H level and the differential current I1−I2 begins to be injected to the capacitor 73, as described above, the voltage V1 at the node #1 increases, and the following operation is repeated.

As described above, in the low-speed oscillator 32, when the direction of the current I2 which flows in the resistor 66 is the direction from the node #1 to the node #2, the voltage V2 at the node #2 becomes equal to the voltage V1−I2×R which is lower than the voltage V1 at the node #1 by the voltage drop I2×R in the resistor 66. When the direction of the current I2 which flows in the resistor 66 is the direction from the node #2 to the node #1, the voltage V2 at the node #2 becomes equal to the voltage V1+I2×R which is higher than the voltage V1 at the node #1 by the voltage drop I2×R in the resistor 66.

Accordingly, the difference V2−V1 between the voltage V2 and the voltage V1 (potential difference between the node #2 and the node #1) is a pulse of which values are alternately changed between −I2×R and +I2×R as shown in FIG. 5.

Further, as shown in FIG. 5, the output of the inverter 61, that is, the output of the schmitt trigger inverter $40_2$ is at the L level when the voltage V2 at the node #2 as the input of the inverter 61 is greater than or equal to the threshold value Vth of the inverter 61, and is at the H level when the voltage V2 at the node #2 is less than the threshold value Vth of the inverter 61.

In addition, the oscillation output signal, that is, the output of the inverter $40_3$, to which the output of the inverter 61 is input, is a signal which is obtained by inverting the output of the inverter 61 as shown in FIG. 5.

Here, regarding the voltage V1 at the node #1 (the other end of the resistor 66) as the input of the schmitt trigger inverter $40_2$, the voltage V1 when the differential current I1−I2 begins to be injected to the capacitor 73 is represented by a voltage Thv1, and the voltage V1 when the differential current I1−I2 begins to be discharged from the capacitor 73 is represented by the voltage Thv2.

As shown in FIG. 5, the voltage Thv1 is the minimum value of the triangular wave voltage V1 of the triangular wave, and the voltage thv2 is the maximum value of the triangular wave voltage V2.

In the case of detecting the output of the inverter 61 which is the input of the schmitt trigger inverter $40_2$ and is also the output of the schmitt trigger inverter $40_2$ from the node #1, the output of the inverter 61 is changed from the H level to the L level when the voltage at the node #1 increases and becomes equal to the voltage Thv2.

Further, the output of the inverter 61 is changed from the L level to the H level when the voltage at the node #1 decreases and becomes equal to the voltage Thv1.

Accordingly, the schmitt trigger inverter $40_2$ functions as a schmitt trigger inverter in which the voltage Thv1 is set as a first threshold value when the polarity of the output is inverted from the L level to the H level and the voltage Thv2 is set as a second threshold value when the polarity of the output is inverted from the H level to the L level.

The hysteresis width Vpp of the schmitt trigger inverter $40_2$ is a difference Thv2−Thv1 between the voltage Thv2 as the second threshold value and the voltage Thv1 as the first threshold value. However, the difference Thv2−Thv1 is caused by the voltage drop in the resistor 66, and is equal to the maximum value of the difference V2−V1 between the voltage V2 at the node #2 and the voltage V1 at the node #1.

Consequently, the hysteresis width Vpp is represented by Expression (1).

$$Vpp = +I2 \times R - (-I2 \times R) \qquad (1)$$
$$= 2 \times I2 \times R$$

According to Expression (1), the hysteresis width Vpp of the schmitt trigger inverter $40_2$ depends on (the resistance value R of) the resistor 66 and the current I2 which flows in the resistor 66. Accordingly, the hysteresis width Vpp can be adjusted to an arbitrary value as a variable by the resistor 66 and the current I2.

Further, the change in the triangular wave voltage V1 shown in FIG. 5, that is, the inclination (hereinafter referred to as an increase rate), at which the voltage V1 increases, and the inclination (hereinafter referred to as a decrease rate), at which the voltage V1 decreases, becomes larger (steeper) as the current I1−I2 flowing in the capacitor 73 becomes larger. Further, the change of the voltage V1 becomes larger as the electrostatic capacitance C of the capacitor 73 becomes smaller.

The oscillatory period T of the low-speed oscillator 32 is equal to the period of the triangular wave voltage V1. The period of the voltage V1 becomes larger (longer) as the difference Thv2−Thv1, which is the hysteresis width Vpp, between the voltage Thv2 and the voltage Thv1 becomes larger. The period of the voltage V1 becomes smaller (shorter) as the change of the voltage V1 becomes larger (more rapid).

The above-mentioned oscillatory period T, which is equal to the period of the voltage V1, is proportional to the hysteresis width Vpp=2×I2×R and the electrostatic capacitance C of the capacitor 73, is inversely proportional to the current I1−I2 which flows in the capacitor 73, and is represented by Expression (2).

$$T = 2 \times I2 \times R \times C/(I1-I2) \times 2 \qquad (2)$$

According to Expression (2), the oscillatory period T (oscillatory frequency) depends on not only the hysteresis width Vpp but also the current I2, the resistor 66 (R), the electrostatic capacitance C of the capacitor 73, and the differential current I1−I2.

Consequently, the oscillatory period T (oscillatory frequency) can be adjusted as a variable by the hysteresis width Vpp (the current I2 and the resistor 66 (R)), the electrostatic capacitance C of the capacitor 73, and the differential current I1−I2. For example, a variable resistor may be employed as the resistor 66. In this case, by adjusting (the resistance value R of) the resistor 66, it is possible to adjust the oscillatory period T. Further, for example, a capacitor with a variable capacitance may be employed as the capacitor 73. In this case, by adjusting the electrostatic capacitance C of the capacitor 73, it is possible to adjust the oscillatory period T.

Here, the oscillatory period T in Expression (2) is independent of not only the threshold value Vth of the inverter 61 but also parameters of the other inverters $40_1$ and $40_3$.

Consequently, even when there is variation in the FETs 51 and 52 and the like, as elements constituting the inverter $40_1$ and the like and thus there is variation in the threshold value Vth and the like, the oscillatory period T is independent of the variations.

As described above, the oscillatory period T of the low-speed oscillator 32 is independent of the variation of elements. Thus, the low-speed oscillator 32 is advantageous in tolerance of (highly tolerant of) variation of elements.

Further, the low-speed oscillator 32 is a ring oscillator. Thus, compared with the PLL circuit, the oscillator achieves low power consumption, and can be mounted on a relatively small area for the sake of achieving a simple circuit configuration without a feedback configuration like the PLL circuit.

In addition, in FIG. 4, the delay section 41 delays change of the voltage V1 at the node #1, which is the input of the schmitt trigger inverter $40_2$, between the voltage Thv1 and the voltage Thv2 (change from the voltage Thv1 to the voltage Thv2 and change from the voltage Thv2 to the voltage Thv1).

The amount of delay of the change in the voltage V1 in the delay section 41 is a period of time during which the voltage V1 changes (increases) from the voltage Thv1 to the voltage Thv2 (and a period of time during which the voltage V1 changes (decreases) from the voltage Thv2 to the voltage Thv1), and corresponds to the oscillatory period T.

Consequently, similarly to the oscillatory period T of Expression (2), the amount of delay of the change in the voltage V1 in the delay section 41 depends on the hysteresis width Vpp which is equal to the difference Thv2−Thv1 between the voltage Thv2 and the voltage Thv1, the change in the voltage V1 (the increase rate and the decrease rate of the voltage V1), that is, the differential current I1−I2 which flows in the capacitor 73, and the electrostatic capacitance C of the capacitor 73.

Second Exemplary Configuration of Low-Speed Oscillator 32

Figure 6:
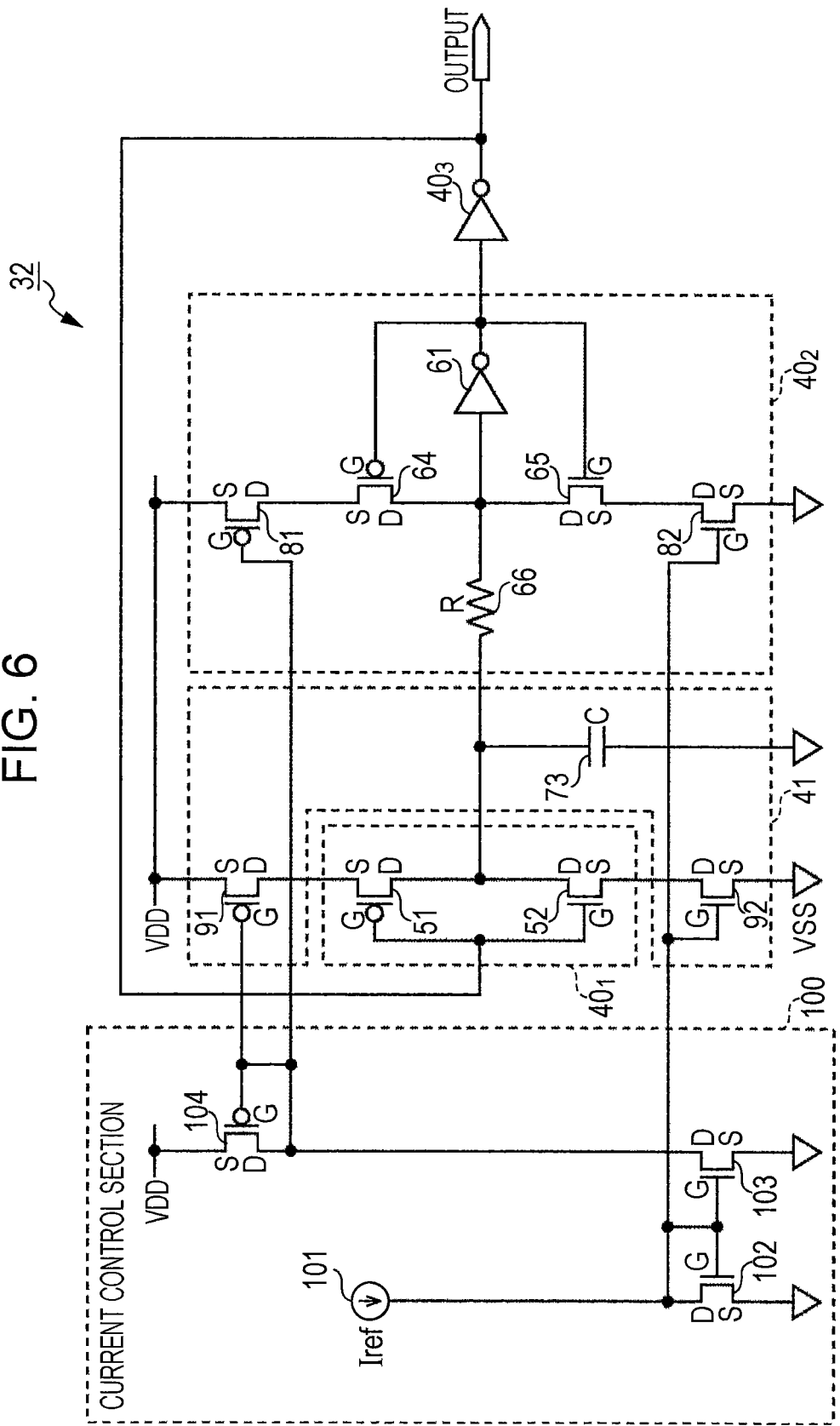
FIG. 6 is a block diagram illustrating a second exemplary configuration of the low-speed oscillator.

FIG. 6 is a block diagram illustrating a second exemplary configuration of the low-speed oscillator 32 of FIG. 2.

It should be noted that, in the drawing, the portions corresponding to those in the case of FIG. 4 are represented by the same reference numerals and signs, and hereinafter the description thereof will be properly omitted.

The low-speed oscillator 32 of FIG. 6 is the same as that in the case of FIG. 4 in that the oscillator has the inverters $40_1$ to $40_3$ and the delay section 41.

However, the low-speed oscillator 32 of FIG. 6 is different from that in the case of FIG. 4 in that a current control section 100 is newly provided, a FET 81 is provided as the current source 62, a FET 82 is provided as the current source 63, a FET 91 is provided as the current source 71, and a FET 92 is provided as the current source 72.

The FET 81 as the current source 62 is a pMOSFET, the source thereof is connected to the power supply, and the drain thereof is connected to the source of the FET 64. Further, the gate of the FET 81 is connected to the gate of the pMOSFET 104 to be described later, and the FET 81 and the FET 104 constitute a current mirror circuit.

The FET 82 as the current source 63 is an nMOSFET, the source thereof is grounded, and the drain thereof is connected to the source of the FET 65. Further, the gate of the FET 82 is connected to the gate of the nMOSFET 102 to be described later, and the FET 82 and the FET 102 constitute a current mirror circuit.

The FET 91 as the current source 71 is a pMOSFET, the source thereof is connected to the power supply, and the drain thereof is connected to the source of the FET 51. Further, the gate of the FET 91 is connected to the gate of the FET 104, and the FET 91 and the FET 104 constitute a current mirror circuit.

The FET 92 as the current source 72 is an nMOSFET, the source thereof is grounded, and the drain thereof is connected to the source of the FET 52. Further, the gate of the FET 92 is connected to the gate of the FET 102, and the FET 92 and the FET 102 constitute a current mirror circuit.

The current control section 100 controls the FET 81 as the current source 62, the FET 82 as the current source 63, the FET 91 as the current source 71, and the FET 92 as the current source 72 so as to flow current corresponding to predetermined reference current.

That is, the current control section 100 has a current source 101, the nMOSFETs 102 and 103, and the pMOSFET 104.

The current source 101 is connected to the drain of the FET 102, and flows the reference current Iref. Accordingly, the reference current Iref flows from the drain of the FET 102 to the source thereof.

The source of the FET 102 is grounded, and the gate thereof is connected to the drain thereof. Further, the gate of the FET 102 is connected to the gates of the FETs 82, 92, and 103. The FETs 102 and 82, the FETs 102 and 92, and the FETs 102 and 103 respectively constitute current mirror circuits.

The source of the FET 103 is grounded, and the drain thereof is connected to the drain of the FET 104.

As described above, the FETs 102 and 103 constitute a current mirror circuit. However, now, for convenience of description, it is assumed that a mirror ratio of FETs 102 and 103 (a ratio of the area of the FET 102 and the area of the FET 103) (the area of the FET 103 based on the area of the FET 102) is 1:1. In this case, the current (the copy of the reference current Iref) the same as the reference current Iref as current corresponding to the reference current Iref, which flows from the drain of the FET 102 to the source thereof, flows from the drain of the FET 103 to the source thereof.

The source of the FET 104 is connected to the power supply, and the gate thereof is connected to the drain thereof. Further, the gate of the FET 104 is connected to the gates of the FETs 81 and 91. The FETs 103 and 81 and the FETs 103 and 91 respectively constitute current mirror circuits.

In addition, as described above, the drain of the FET 103 is connected to the drain of the FET 104. Therefore, similarly to the FET 103, the current, which is the same as the reference current Iref, flows from the source of the FET 104 to the drain thereof.

Here, as described above, the current same as the reference current Iref flows in the FETs 102 and 103. However, hereinafter, the situation, in which the current the same as the reference current Iref flows in the FET 102, can be expressed as follows: the reference current Iref flows in the FET 102. The FET 103 is the same.

In the low-speed oscillator 32 configured as described above, the FET 81 and the FET 104 constitute a current mirror circuit. Hence, the current I (81) corresponding to the reference current Iref, which flows in the FET 104, flows from the source of the FET 81 to the drain thereof, in accordance with a mirror ratio M (104:81) of the FETs 104 and 81.

Further, the FET 82 and the FET 102 constitute a current mirror circuit. Hence, the current I (82) corresponding to the reference current Iref, which flows in the FET 102, flows from the drain of the FET 82 to the source thereof, in accordance with a mirror ratio M (102:82) of the FETs 102 and 82.

Furthermore, the FET 91 and the FET 104 constitute a current mirror circuit. Hence, the current I (91) corresponding to the reference current Iref, which flows in the FET 104, flows from the source of the FET 91 to the drain thereof, in accordance with a mirror ratio M (104:91) of the FETs 104 and 91.

In addition, the FET 92 and the FET 102 constitute a current mirror circuit. Hence, the current I (92) corresponding to the reference current Iref, which flows in the FET 102, flows from the drain of the FET 92 to the source thereof, in accordance with a mirror ratio M (102:92) of the FETs 102 and 92.

By making the mirror ratio M (104:81) of the FETs 104 and 81 coincide with the mirror ratio M (102:82) of the FETs 102 and 82, the current I (81), which flows in the FET 81, and the current I (82), which flows in the FET 82, are made to be the same current I2.

Further, by making the mirror ratio M (104:91) of the FETs 104 and 91 coincide with the mirror ratio M (102:92) of the FETs 102 and 92, the current I (91), which flows in the FET 91, and the current I (92), which flows in the FET 92, are made to be the same current I1.

Then, by adjusting the mirror ratios M (104:91) and M (102:92) such that the ratios are larger than the mirror ratios M (104:81) and M (102:82), the current I1, which is the current I (91) flowing in the FET 91 and the current I (92) flowing in the FET 92, becomes larger than the current I2 which is the current I (81) flowing in the FET 81 and the current I (82) flowing in the FET 82.

It should be noted that, by providing the current source 101 in the current control section 100 as shown in FIG. 6, the reference current Iref not only can be acquired from the current source 101, but also can be acquired (supplied) from another circuit which is not shown in the drawing.

Third Exemplary Configuration of Low-Speed Oscillator 32

Figure 7:
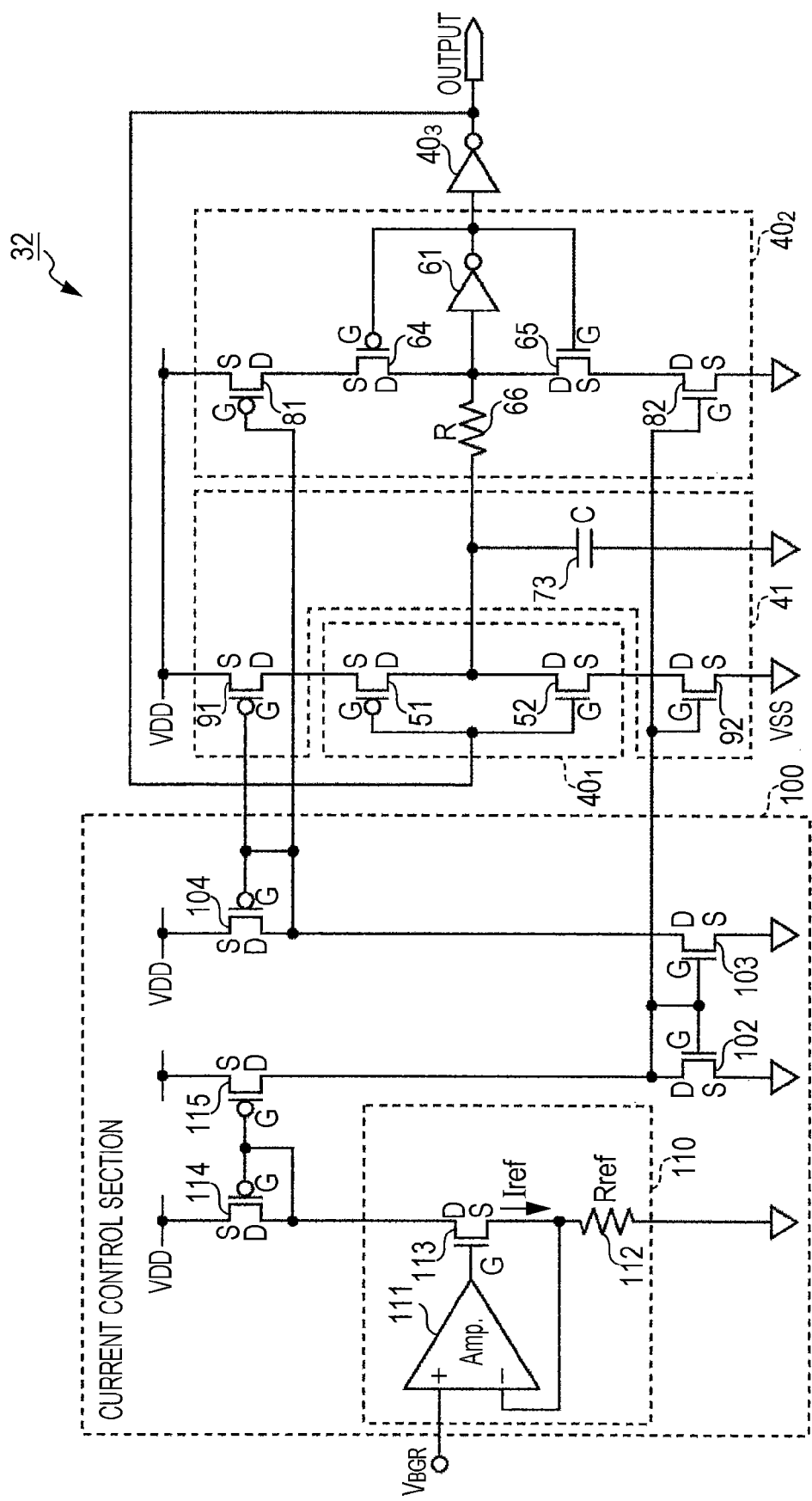
FIG. 7 is a block diagram illustrating a third exemplary configuration of the low-speed oscillator.

FIG. 7 is a block diagram illustrating a third exemplary configuration of the low-speed oscillator 32 of FIG. 2.

It should be noted that, in the drawing, the portions corresponding to those in the case of FIG. 6 are represented by the same reference numerals and signs, and hereinafter the description thereof will be properly omitted.

The low-speed oscillator 32 of FIG. 7 is the same as that in the case of FIG. 6 in that the oscillator has the inverters $40_1$ to $40_3$, the delay section 41, and the current control section 100.

However, the low-speed oscillator 32 of FIG. 7 is different from that in the case of FIG. 6 in that, instead of the current source 101 of the current control section 100, a current generation section 110 and FETs 114 and 115 are provided.

The current generation section 110 is supplied with, for example, a reference voltage (BGR voltage) $V_{BGR}$, which can be obtained by a BGR (Band Gap Reference) circuit not shown in the drawing, from the outside.

The current generation section 110 generates, in response to the reference voltage $V_{BGR}$ supplied thereto, the reference current Iref corresponding to the reference voltage $V_{BGR}$.

That is, the current generation section 110 has an operational amplifier 111, a resistor 112, and an nMOSFET 113.

The reference voltage $V_{BGR}$ is supplied (applied) from the BGR circuit, which is not shown in the drawing, to a non-inverting input terminal (+) of the operational amplifier 111. One end of the resistor 112, of which the other end is grounded, is connected to an inverting input terminal (−) of the operational amplifier 111. The output terminal of the operational amplifier 111 is connected to the gate of the FET 113.

The source of the FET 113 is connected to the connection point between the inverting input terminal of the operational amplifier 111 and the resistor 112, and the drain of the FET 113 is connected to the drain of the pMOSFET 114.

The respective source of the FETs 114 and 115 are connected to the power supply, and the gates are connected to each other. Further, the gate and the drain of the FET 114 are connected, and the FETs 114 and 115 constitute a current mirror circuit.

The drain of the FET 115 is connected to the drain of the FET 102 which constitutes a current mirror circuit.

Here, for convenience of description, it is assumed that a mirror ratio M (114:115) of the FETs 114 and 115 which constitute the current mirror circuit, is one to one (1:1).

In the current control section 100 of FIG. 7, when the reference voltage $V_{BGR}$ from the BGR circuit not shown in the drawing is applied to the non-inverting input terminal of the operational amplifier 111, due to so-called imaginary short (virtual short), the voltage of the inverting input terminal of the operational amplifier 111 is the reference voltage $V_{BGR}$ which is applied to the non-inverting input terminal.

One end of the resistor 112, of which the other end is grounded, is connected to the inverting input terminal of the operational amplifier 111. Therefore, the reference voltage $V_{BGR}$, which is the voltage of the inverting input terminal of the operational amplifier 111, is applied to the resistor 112. Consequently, assuming that the resistance value if the resistor 112 is Rref, the current Iref, which flows in the resistor 112, is represented by Expression (3).

$$Iref = V_{BGR}/Rref \qquad (3)$$

As described above, in the resistor 112, the current Iref proportional to the reference voltage $V_{BGR}$. Therefore, the resistor 112 functions as a resistor for voltage-to-current conversion which converts the reference voltage $V_{BGR}$ into the current Iref.

The voltage of the output terminal of the operational amplifier 111 is larger than the reference voltage $V_{BGR}$ which is applied to the resistor 112. Therefore, the voltage of the gate of the FET 113 connected to the output terminal of the operational amplifier 111 is larger than the voltage of the source of the FET 113 connected to the resistor 112, and thus the FET 113 is turned on.

Accordingly, the current Iref, which flows in the resistor 112, flows from the drain of the FET 113 toward the source thereof. Further, the current, which flows in the FET 113, flows the source of the FET 114 toward the drain thereof, and is copied in the FET 115 which constitutes a current mirror circuit together with the FET 114. Thus, the current Iref (the current the same as the current Iref) flows from the source of the FET 115 toward the drain thereof.

Since the drain of the FET 115 is connected to the drain of the FET 102, the current Iref, which flows in the FET 115, flows as reference current in the FET 102.

Since the current Iref flows in the FET 102, hereinafter, as described in FIG. 6, current flows in the FET 81 as the current source 62, the FET 82 as the current source 63, the FET 91 as the current source 71, and the FET 92 as the current source 72.

When the mirror ratio M (104:91) of the FETs 104 and 91 and the mirror ratio M (102:92) of the FETs 102 and 92 are represented as M1, the current I1, which flows in the FET 91 as the current source 71 and the FET 92 as the current source 72, is represented by Expression (4).

$$I1 = M1 \times Iref \qquad (4)$$

Further, when the mirror ratio M (104:81) of the FETs 104 and 81 and the mirror ratio M (102:82) of the FETs 102 and 82 are represented as M2, the current I2, which flows in the FET 81 as the current source 62 and the FET 82 as the current source 63, is represented by Expression (5).

$$I2 = M2 \times Iref \qquad (5)$$

It should be noted that, in the embodiment, the mirror ratio M1 is greater than the mirror ratio M2.

By using Expressions (3) and (5), the hysteresis width Vpp of Expression (1) is represented by Expression (6).

$$Vpp = 2 \times I2 \times R = 2 \times M2 \times Iref \times R = 2 \times M2 \times R/Rref \times V_{BGR} \qquad (6)$$

According to Expression (6), the hysteresis width Vpp can be adjusted by the resistance ratio R/Rref of the resistor 66 (R) and the resistor 112 (Rref).

Further, the reference voltage $V_{BGR}$, which is supplied from the BGR circuit, does not depend on the power supply voltage VDD, and the temperature. Furthermore, the resistance ratio R/Rref is stable without depending on operation environment or variation in manufacture.

Consequently, the hysteresis width Vpp of Expression (6) is independent of fluctuation in the power supply voltage or the temperature and the variation of elements. The low-speed oscillator 32 of FIG. 7, which is supplied with the reference voltage $V_{BGR}$ from the BGR circuit, is advantageous in tolerance of (highly tolerant of) fluctuation in the power supply voltage or the temperature and the variation of elements.

Description of Computer According to the Present Technology

Next, the above-mentioned low-speed oscillator 32 can be simulated on a computer.

When the low-speed oscillator 32 is simulated on the computer, a program for causing the computer to perform simulation for functioning as the low-speed oscillator 32, that is, the inverters 40₁ to 40₂ₙ₊₁, the delay section 41, and the current control section 100 are installed in the computer.

FIG. 8 shows an exemplary configuration of a computer, in which the program executing a series of the processes mentioned above is installed, according to an embodiment of the present technology.

The program can be recorded in advance in a hard disk 205 or a ROM 203 as a recording medium which is built in the computer.

Alternatively, the program can be stored (recorded) in a removable recording medium 211. Such a removable recording medium 211 can be provided as so-called package software. Here, examples of the removable recording medium 211 include a flexible disk, a CD-ROM (Compact Disc Read Only Memory), an MO (Magneto Optical) disk, a DVD (Digital Versatile Disc), a magnetic disk, a semiconductor memory, and the like.

It should be noted that, otherwise the program is installed in the computer from the above-mentioned removable recording medium 211, the program may be downloaded to the computer through a broadcast network or a communication network, and may be installed in the built-in hard disk 205. That is, for example, the program may be wirelessly transferred from a download site to the computer through an artificial satellite for digital satellite broadcasting, or may be transferred with wires to the computer through a LAN (Local Area Network), that is, the Internet.

The computer is built in a CPU (Central Processing Unit) 202. An input/output interface 210 is connected to the CPU 202 through a bus 201.

When the CPU 202 receives an input of a command which is issued when a user operates an input section 207 through the input/output interface 210, the CPU 202 executes the program stored in the ROM (Read Only Memory) 203 in response to the input. Alternatively, the CPU 202 loads the program, which is stored in the hard disk 205, on the RAM (Random Access Memory) 204, and executes the program.

Thereby, the CPU 202 performs the processes based on the above-mentioned flowchart, or performs the processes based on the configuration of the above-mentioned block diagram. Then, the CPU 202 outputs the processing result from an output section 206 through, for example, the input/output interface 210 as necessary, or transmits the result from the communication section 208 and performs recording or the like in the hard disk 205.

In addition, the input section 207 includes a keyboard, a mouse, a microphone, and the like. Further, the output section 206 includes an LCD (Liquid Crystal Display), a speaker, and the like.

Here, in the present specification, it is not indispensable to chronologically perform the processes, which are performed by the computer in accordance with the program, in order of the processes described as the flowchart. That is, the processes, which are performed by the computer in accordance with the program, also include processes which are executed in parallel or separately executed (for example, parallel processes or processes using an object).

Further, the program may be processed by a single computer (processor), and may be distributively processed by a plurality of computers. Furthermore, the program may be transferred to a distant computer and executed by the computer.

In addition, The embodiment of the present technology is not limited to the embodiments mentioned above, and may be modified into various forms of the embodiment without departing from the technical scope of the present technology.

That is, the embodiment described the case where the signal which is output by the low-speed oscillator 32 is used as the clock for operating the image sensor 12 constituting the digital camera, but the signal, which is output by the low-speed oscillator 32, may be used as the clock for operating the other arbitrary device.

It should be noted that the present technology may adopt the following configurations.

[1] An oscillator including: inverters that are connected in a loop shape and of which the number is an odd number greater than or equal to three; and a delay section that delays change in a voltage which is input to one inverter of the odd number of inverters, wherein the one inverter is a schmitt trigger inverter, wherein the schmitt trigger inverter includes a current source, and a resistor in which current supplied by the current source flows, and wherein a hysteresis width of the schmitt trigger inverter depends on the current which flows in the resistor.

[2] The oscillator according to [1], wherein the delay section includes a different current source and a capacitor, and wherein an oscillatory period depends on current, which flows in the capacitor, and the hysteresis width.

[3] The oscillator according to [2], wherein the schmitt trigger inverter further includes a switch that changes a direction of the current, which flows in the resistor, in response to an oscillation output signal which is output by the oscillator.

[4] The oscillator according to [3], further including a current control section that controls the current source and the different current source so as to flow current corresponding to predetermined reference current.

[5] The oscillator according to [4], further including a current generation section that generates, in response to a predetermined reference voltage, the reference current corresponding to the reference voltage.

[6] The oscillator according to [5], wherein the current generation section includes an operational amplifier of which a non-inverting input terminal is supplied with the reference voltage and of which a inverting input terminal is connected to one end of a resistor for voltage-to-current conversion, where the other end of the resistor is grounded, and the resistor for voltage-to-current conversion, and wherein the reference current flows in the resistor for voltage-to-current conversion.

[7] The oscillator according to any one of [4] to [6], wherein the current control section includes an one-side transistor which constitutes a current mirror circuit and in which the reference current flows, and wherein the current source and the different current source include other-side transistors which constitutes the current mirror circuit and in which current corresponding to the reference current flows.

[8] The oscillator according to any one of [3] to [7], wherein each of the different inverters, which are other than the schmitt trigger inverter, is a CMOS (Complementary MOS) inverter in which drains of a pMOSFET (positive channel Metal Oxide Semiconductor Field Effect Transistor) and an nMOSFET (negative channel MOSFET) are connected to each other and gates of the pMOSFET and the nMOSFET are connected to each other, wherein the schmitt trigger inverter includes a different pMOSFET and a different nMOSFET, of which respective drains are connected to each other, as the switch, a CMOS inverter of which an output terminal is connected to respective gates of the different pMOSFET and the different nMOSFET and of which an input terminal is connected to a connection point between the drains of the different pMOSFET and the different nMOSFET, a first current source, which is connected to a source of the different pMOSFET, and a second current source, which is connected to a source of the different nMOSFET and flows current the same as that of the first current source, as the current source, and the resistor of which one end is connected to the connection point between the drains of the different pMOSFET and the different nMOSFET and of which the other end is connected to an output terminal of a pre-stage inverter of the schmitt trigger inverter, and wherein the delay section includes the capacitor of which one end is grounded and the other end is connected to the output terminal of the pre-stage inverter, and a third current source, which is connected to a source of a pMOSFET constituting the pre-stage inverter, and a fourth current source, which is connected to a source of an nMOSFET constituting the pre-stage inverter and flows current the same as that of the third current source, as the different current source.

[9] The oscillator according to any one of [2] to [8], wherein the oscillatory period depends on the capacitor, the current which flows in the capacitor, and the hysteresis width.

[10] The oscillator according to any one of [1] to [9], wherein the hysteresis width depends on the resistor and the current which flows in the resistor.

[11] The oscillator according to any one of [2] to [9], wherein the capacitor is a capacitor with a variable capacitance, and wherein the oscillatory period is adjusted by adjusting the capacitance of the capacitor.

[12] The oscillator according to any one of [2] to [9] or [11], wherein the resistor has a variable resistance, and wherein the oscillatory period is adjusted by adjusting the resistance.

[13] An oscillating method including: delaying change in a voltage input to one inverter of inverters, which are connected in a loop shape and of which the number is an odd number greater than or equal to three, by a delay section of an oscillator including the odd number of inverters and the delay section, wherein the one inverter is a schmitt trigger inverter, wherein the schmitt trigger inverter includes a current source, and a resistor in which current supplied by the current source flows, and wherein a hysteresis width of the schmitt trigger inverter depends on the current which flows in the resistor.

[14] An image sensor operated in synchronization with a signal that is output by an oscillator including inverters, which are connected in a loop shape and of which the number is an odd number greater than or equal to three, and a delay section which delays change in a voltage which is input to one inverter of the odd number of inverters, wherein the one inverter is a schmitt trigger inverter, wherein the schmitt trigger inverter includes a current source, and a resistor in which current supplied by the current source flows, and wherein a hysteresis width of the schmitt trigger inverter depends on the current which flows in the resistor.

[15] An imaging apparatus including: an oscillator that includes inverters, which are connected in a loop shape and of which the number is an odd number greater than or equal to three, and a delay section which delays change in a voltage which is input to one inverter of the odd number of inverters; and an image sensor that is operated in synchronization with a signal which is output by the oscillator, wherein the one inverter is a schmitt trigger inverter, wherein the schmitt trigger inverter includes a current source, and a resistor in which current supplied by the current source flows, and wherein a hysteresis width of the schmitt trigger inverter depends on the current which flows in the resistor.

The present disclosure contains subject matter related to that disclosed in Japanese Priority Patent Application JP 2012-101341 filed in the Japan Patent Office on Apr. 26, 2012, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An oscillator comprising:
    inverters that are connected in a loop shape and of which the number is an odd number greater than or equal to three; and
    a delay section that delays change in a voltage that is input to one inverter of the odd number of inverters,
    wherein the one inverter is a schmitt trigger inverter,
    wherein the schmitt trigger inverter includes
        a current source, and
        a resistor in which current supplied by the current source flows,
    wherein a hysteresis width of the schmitt trigger inverter depends on the current that flows in the resistor,
    wherein the delay section includes a different current source and a capacitor, and
    wherein an oscillatory period depends on current, which flows in the capacitor, and the hysteresis width.

2. The oscillator according to claim 1, wherein the schmitt trigger inverter further includes a switch that changes a direction of the current, which flows in the resistor, in response to an oscillation output signal which is output by the oscillator.

3. The oscillator according to claim 2, further comprising a current control section that controls the current source and the different current source so as to flow current corresponding to predetermined reference current.

4. The oscillator according to claim 3, further comprising a current generation section that generates, in response to a predetermined reference voltage, the reference current corresponding to the reference voltage.

5. The oscillator according to claim 4,
    wherein the current generation section includes
        an operational amplifier of which a non-inverting input terminal is supplied with the reference voltage and of which a inverting input terminal is connected to one end of a resistor for voltage-to-current conversion, where the other end of the resistor is grounded, and the resistor for voltage-to-current conversion, and wherein the reference current flows in the resistor for voltage-to-current conversion.

6. The oscillator according to claim 4, wherein the current control section includes an one-side transistor which constitutes a current mirror circuit and in which the reference current flows, and wherein the current source and the different current source include other-side transistors that constitutes the current mirror circuit and in which current corresponding to the reference current flows.

7. The oscillator according to claim 4, wherein each of the different inverters, which are other than the schmitt trigger inverter, is a CMOS (Complementary MOS) inverter in which drains of a pMOSFET (positive channel Metal Oxide Semiconductor Field Effect Transistor) and an nMOSFET (negative channel MOSFET) are connected to each other and gates of the pMOSFET and the nMOSFET are connected to each other, wherein the schmitt trigger inverter includes a different pMOSFET and a different nMOSFET, of which respective drains are connected to each other, as the switch, a CMOS inverter of which an output terminal is connected to respective gates of the different pMOSFET and the different nMOSFET and of which an input terminal is connected to a connection point between the drains of the different pMOSFET and the different nMOSFET, a first current source, which is connected to a source of the different pMOSFET, and a second current source, which is connected to a source of the different nMOSFET and flows current the same as that of the first current source, as the current source, and the resistor of which one end is connected to the connection point between the drains of the different pMOSFET and the different nMOSFET and of which the other end is connected to an output terminal of a pre-stage inverter of the schmitt trigger inverter, and wherein the delay section includes the capacitor of which one end is grounded and the other end is connected to the output terminal of the pre-stage inverter, and a third current source, which is connected to a source of a pMOSFET constituting the pre-stage inverter, and a fourth current source, which is connected to a source of an nMOSFET constituting the pre-stage inverter and flows current the same as that of the third current source, as the different current source.

8. The oscillator according to claim 4, wherein the oscillatory period depends on the capacitor, the current which flows in the capacitor, and the hysteresis width.

9. The oscillator according to claim 4, wherein the hysteresis width depends on the resistor and the current which flows in the resistor.

10. The oscillator according to claim 4, wherein the capacitor is a capacitor with a variable capacitance, and wherein the oscillatory period is adjusted by adjusting the capacitance of the capacitor.

11. The oscillator according to claim 4, wherein the resistor has a variable resistance, and wherein the oscillatory period is adjusted by adjusting the resistance.

12. An oscillating method comprising:

delaying change in a voltage input to one inverter of inverters, which are connected in a loop shape and of which the number is an odd number greater than or equal to three, by a delay section of an oscillator including the odd number of inverters and the delay section, wherein the one inverter is a schmitt trigger inverter, wherein the schmitt trigger inverter includes a current source, and a resistor in which current supplied by the current source flows, and wherein a hysteresis width of the schmitt trigger inverter depends on the current that flows in the resistor, wherein the delay section includes a different current source and a capacitor, and wherein an oscillatory period depends on current, which flows in the capacitor, and the hysteresis width.

13. An image sensor operated in synchronization with a signal that is output by an oscillator including inverters, which are connected in a loop shape and of which the number is an odd number greater than or equal to three, and a delay section which delays change in a voltage which is input to one inverter of the odd number of inverters, wherein the one inverter is a schmitt trigger inverter, wherein the schmitt trigger inverter includes a current source, and a resistor in which current supplied by the current source flows, wherein a hysteresis width of the schmitt trigger inverter depends on the current that flows in the resistor, wherein the delay section includes a different current source and a capacitor, and wherein an oscillatory period depends on current, which flows in the capacitor, and the hysteresis width.

14. An imaging apparatus comprising:

an oscillator that includes inverters, which are connected in a loop shape and of which the number is an odd number greater than or equal to three, and a delay section which delays change in a voltage which is input to one inverter of the odd number of inverters; and an image sensor that is operated in synchronization with a signal that is output by the oscillator, wherein the one inverter is a schmitt trigger inverter, wherein the schmitt trigger inverter includes a current source, and a resistor in which current supplied by the current source flows, wherein a hysteresis width of the schmitt trigger inverter depends on the current that flows in the resistor, wherein the delay section includes a different current source and a capacitor, and wherein an oscillatory period depends on current, which flows in the capacitor, and the hysteresis width.

15. An oscillator comprising:

a first inverter;

a second inverter;

a third inverter;

a fourth inverter;

a resistor; and a capacitor, wherein an output node of the first inverter is connected to a first terminal of the capacitor, and connected to an input node of the second inverter through the resistor, wherein an output node of the second inverter is connected to an input node of the third inverter and an input node of the fourth inverter, wherein an output node of the third inverter is connected to the input node of the second inverter and the first terminal of the capacitor, wherein an output node of the fourth inverter is connected to the input node of the first inverter and an output node of the oscillator, wherein the first inverter is configured to supply a first current from a first current source to the first terminal of the capacitor, and wherein the third inverter is configured to supply a second current from a second current source to the first terminal of the capacitor.

* * * * *

UNITED STATES PATENT AND TRADEMARK OFFICE
CERTIFICATE OF CORRECTION

PATENT NO. : 9,083,352 B2  
APPLICATION NO. : 13/828545  
DATED : July 14, 2015  
INVENTOR(S) : Eiji Hirata et al.

Page 1 of 1

It is certified that error appears in the above-identified patent and that said Letters Patent is hereby corrected as shown below:

ON THE TITLE PAGE,
AT (30) Foreign Application Priority Data Applicant:

Please replace "201-101341" with --2012-101341--

Signed and Sealed this
Fourteenth Day of June, 2016

Michelle K. Lee
*Director of the United States Patent and Trademark Office*